Figure 1:
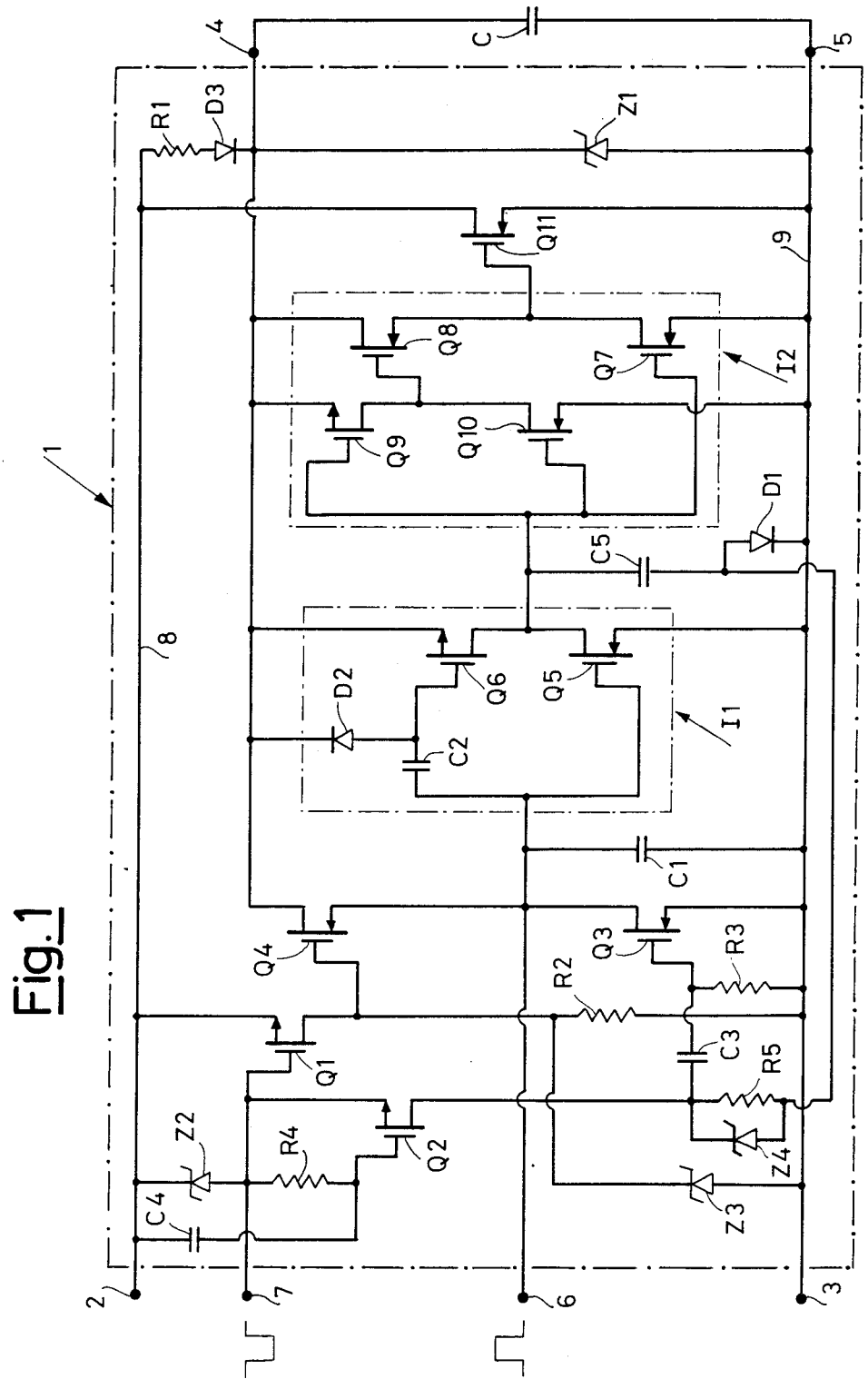

United States Patent [19]

Bellinvia et al.

[11] Patent Number: 4,764,692
[45] Date of Patent: Aug. 16, 1988

[54] MOS POWER DEVICE USABLE BOTH AS AN N-CHANNEL MOS TRANSISTOR AND AS A P-CHANNEL MOS TRANSISTOR

[75] Inventors: Gianpietro Bellinvia, Milan; Giuseppe Faini, Vimercate, both of Italy

[73] Assignee: SGS Microelettronica S.p.A., Catania, Italy

[21] Appl. No.: 908,691

[22] Filed: Sep. 18, 1986

[30] Foreign Application Priority Data

Oct. 7, 1985 [IT] Italy ................. 22380 A/85

[51] Int. Cl.$^4$ ................. H03K 19/094; H03K 17/687
[52] U.S. Cl. ................. 307/451; 307/576; 307/578; 307/579
[58] Field of Search ........... 307/296 A, 571, 573, 307/578–579, 576, 252 P, 451

[56] References Cited

U.S. PATENT DOCUMENTS 4,542,310 9/1985 Ellis et al. ................. 307/579

Primary Examiner—John S. Heyman
Assistant Examiner—M. R. Wambach
Attorney, Agent, or Firm—Gerald J. Ferguson, Jr.

[57] ABSTRACT

An N-channel power switch is controllable through two inputs by typical control signals for N-channel and P-channel MOS transistors. In the first case the control signal is brought back with unchanged polarity on the gate of the power switch which consequently operates in the peculiar manner of an N-channel device. In the second case the control signal charges a capacitor which reproduces on the gate of the power switch the same operating condition, causing it to operate again as an N-channel device although with P-type control.

7 Claims, 2 Drawing Sheets

MOS POWER DEVICE USABLE BOTH AS AN N-CHANNEL MOS TRANSISTOR AND AS A P-CHANNEL MOS TRANSISTOR

The present invention relates to an MOS power device usable as an MOS transistor with an N-channel and as an MOS transistor with a P channel.

In the field of MOS power devices there are known transistors with N-channels which can be driven in conduction by means of positive gate voltage in relation to the source voltage and MOS transistors with P-channels which can be driven in conduction by means of negative gate voltage in relation to the source voltage.

The former are generally preferable to the latter from the view point of cost and switching speed and because they are easy to integrate.

There is also the need and/or functional economy of sometimes accomplishing more or less complex structures in which it is useful to insert one or more MOS transistors with P-channels.

This is the case of PWM (pulse width modulation) bridge actuators which preferably include two P-channel MOS transistors and two N-channel MOS transistors arranged in a bridge with drain in common between a positive supply lead and a negative supply lead. In such a device the two N-channel transistors are made to conduct by applying to the gate a voltage which is positive in relation to the negative supply lead while the two P-channel transistors are made to conduct by applying to the gate a voltage which is negative in relation to the positive supply lead. Two different ways of controlling are thus provided for the two types of transistors.

The primary object of the present invention is to accomplish an MOS power device which would be usable and controllable as a P-channel MOS transistor without suffering from the usual penalties of cost, speed and integration difficulty typical of transistors of this type.

Another object of the present invention is to accomplish an MOS power device usable and controllable either as a P-channel MOS transistor or as an N-channel MOS transistor, in particular in such a manner as to be employed in both the provided versions in a bridge structure of the type mentioned above.

This and other objects of the present invention are achieved by means of an MOS power device characterized in that an N-channel power switch with drain and source connected to a positive supply lead and a negative supply lead respectively, two cascaded inverters assigned to gate control of said power switch and two inputs for said inverters, a first input being for a first voltage control signal positive in relation to said negative lead and the second input being for a second control signal the voltage of which is negative in relation to said positive lead and there being provided a capacitor placed in parallel with said first input and switching means interposed between said second input and said capacitor to allow said second control signal to cause charging of said capacitor at a voltage which is positive in relation to said negative lead.

In other words an MOS device based on an N-channel power switch and thus in possession of the requisites of cost and switching speed of devices of that type is made usable in N or P versions by being provided with two independent inputs of which one, the first abovementioned, may be considered and used as a gate input for an N-channel transistor, i.e. controllable with positive signal in relation to the negative supply lead, and the other, the second abovementioned, may be considered and used as a gate input for a P-channel transistor, i.e. controllable with a signal which is negative in relation to the positive supply lead.

This results in considerable construction benefits in addition to the functional benefits such as single circuitry structure easy to integrate being employable with different functions depending on necessity and economy. In particular a bridge structure can provide four identical devices in accordance with the invention, two used as N-channel transistors and two as P-channel transistors.

By accomplishing the various control elements of the device with a kind of circuitry, i.e., CMOS, that does not draw current between waveform transitions, it is also possible to limit as much as possible current absorption of the control part as is certainly desirable. This permits internal supply of the control part.

Thus formed the device lends itself to control with a low-level logic circuit such as the one obtainable at the output by a microprocessor.

Figure 2:
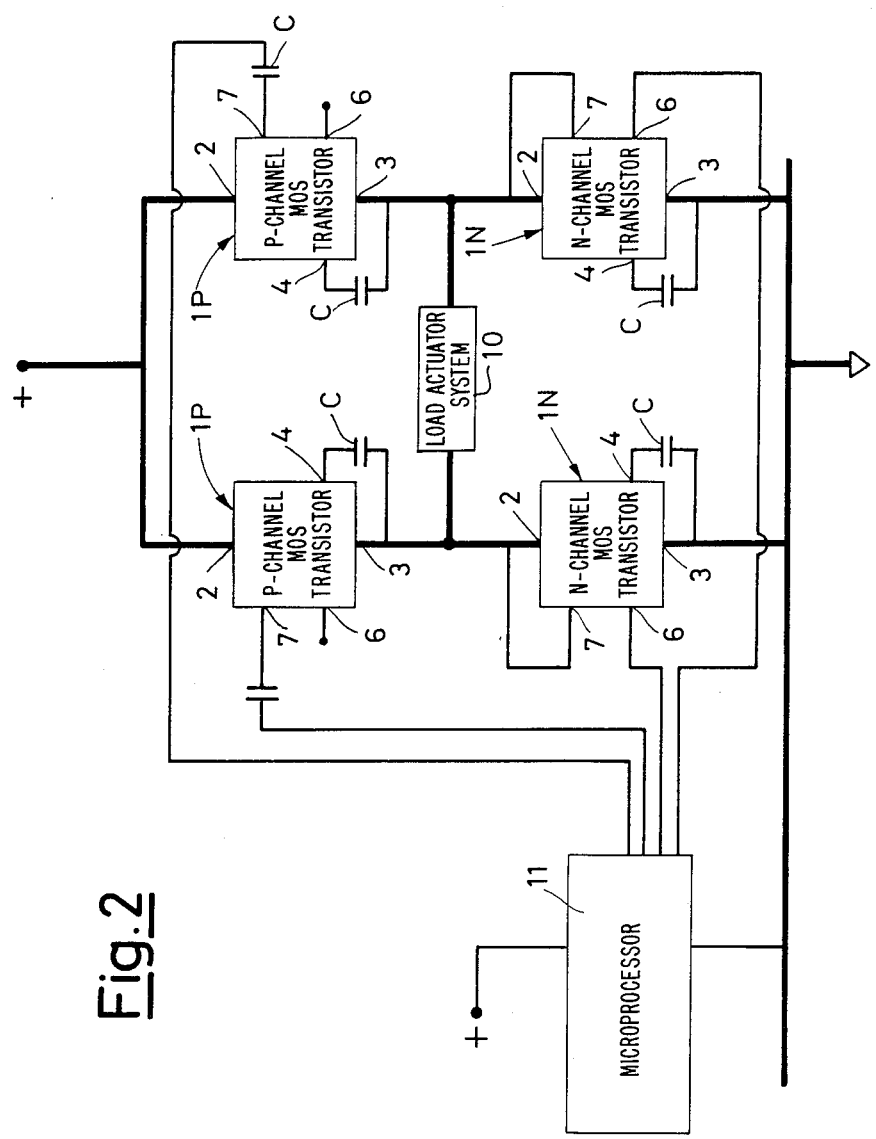

The features and advantages of the present invention will be made clearer by the following detailed description of a possible practical embodiment thereof illustrated as a nonlimiting example in the annexed drawings wherein:

FIG. 1 shows the circuit diagram complete with a power device in accordance with the invention, and FIG. 2 shows a block diagram of an actuation system with microprocessor control which uses four devices in accordance with the invention arranged in a bridge structure.

With reference to FIG. 1 the MOS device illustrated therein consists of a single integrable set 1 from which issues a terminal 2 for positive supply, a terminal 3 for negative supply or reference, two terminals 4 and 5 connected through an external capacitor of relatively large capacity, e.g. 0.1 μF, a terminal 6 for control of the N-channel type and a terminal 7 for control of the P-channel type.

The integrable set 1 includes as its basic element a power switch of the N-channel MOS type denominated Q11 which has its drain connected to a positive supply lead 8 extending from the terminal 2 and its source connected to a negative supply or reference lead 9 extending from the terminal 3 to the terminal 5.

Gate control of the power switch Q11 is provided by two CMOS inverters I1 and I2 having reversed polarity connected in cascade of which the first comprises an N-channel switch element Q5 and a P-channel switch element Q6 and the second, designed to deliver a higher current suitable for control of Q11, comprises three N-channel switch elements Q7, Q8 and Q10 and a P-channel switch element Q9. The inverter I1 includes furthermore a capacitor C2, e.g. of 10 pF, and a diode D2 for the purposes which will be set forth below. Supply for the two inverters at reduced voltage in relation to that of the power switch Q11 is supplied by the external capacitor C loaded by the positive supply lead 8 through a resistor R1 and a diode D3 and is stabilized by a Zener diode Z1.

The input of the inverter I1 is connected to the terminal 6 which is designed to receive a control signal with positive voltage in relation to the negative lead 9, i.e. a control signal suitable for an N-channel transistor. Since the two inverters have reversed polarity, the above control signal is again with the same polarity but amplified on the gate of the power switch 11 which in the presence of said signal on the terminal 6 is thus correctly made to operate in the manner peculiar to an N-channel device.

The input of the switch I1 is connected to the negative lead 9 through a capacitor C1 which is the essential component for operation of the power device 1 in the manner of a P-channel transistor as will be made clear below.

To permit said manner of operation the terminal 7, which is designed to receive a voltage control signal negative in relation to the positive lead 8, which is protected by the Zener diode Z2, i.e. a control signal suitable for a P-channel transistor, is connected to the gate of a P-channel MOS switch element Q1 which has its source connected to the positive lead 8 and its drain connected to the negative lead 9 through a resistor R2, e.g. of 33K, in parallel with which is placed a Zener diode Z3. The drain of the element Q1 is also connected to the gate of an N-channel MOS switch element Q4 which has its drain connected to the supply terminal 4 and its source connected to the negative lead 9 through the drain-source connection of an N-channel MOS switch element Q3. The gate of Q3 is connected to the negative lead 9 through a resistor R3, e.g. of 100K, and is also connected through a capacitor C3, e.g. of 10 pF, to the drain of a P-channel MOS switch element which has its source connected to the control terminal 7 and its gate connected to the positive terminal through a capacitor C4, e.g. of 10 pF, and to the control terminal 7 through a resistor R4, e.g. of 47K. The drain of Q2 is connected to the output of the inverter I1 through a resistance R5, e.g. of 47K, stabilized by a Zener diode Z4 and a capacitor C5, e.g. of 40 pF, with associated diode D1.

The described device, basically of the N type, is capable of operating both as a power transistor with a positive control signal in relation to the lead 9 on the terminal 6, in which case it behaves like an N-type transistor, and with a negative control signal in relation to the lead 8 on the terminal 7, in which case it behaves like a P-type transistor but having all the beneficial characteristics of cost, switching speed and integrability of an N-type device which in reality it is in its power part (switch Q11).

Terminals 6 and 7 are obviously used alternatively, according to whether N-channel operation (Terminal 6) or P-channel operation of the device is desired.

More precisely, in case of application of a positive control signal on the terminal 6, as shown in FIG. 1, its positive front causes through the inverters I1 and I2 conduction of the power switch Q11 whose gate has positive voltage in relation to the source, i.e. in the correct condition for conduction of an element with an N-channel. The subsequent negative front of the control signal then brings the switch Q11 into interdiction.

In this mode of operation the presence of C2 and D2 permits the integrable set 1 to operate with control signals at 6 with a voltage lower than that between the terminals 4 and 5 hence small enough to permit control by a microprocessor. It should be noted that the control part (inverters I1 and I2) of the device absorbs a very small current supplied by the external capacitor C only when coinciding with the switching fronts of the control signal. Current absorption is thus very small and dependent upon the frequency of said switching fronts.

In the case of application of a negative control signal on the terminal 7 as shown in FIG. 1 the negative front thereof causes in turn momentary conduction of Q1, which generates on R5 a voltage drop which puts Q4 in conduction which is operating as a source follower. The current of Q4 rapidly charges the capacitor C1 at the ends of which is stabilized a positive voltage equivalent basically to a positive control signal applied to the terminal 6. Even though in the presence of a different control signal actually applied, more precisely of a control signal for a P-channel transistor, the device 1 behaves as though a control signal for an N-channel transistor were applied thereto, i.e. the power switch Q11 is placed in conduction in accordance with the modes and characteristics of an N-channel transistor.

The conduction of Q11 causes reduction of the voltage of the positive terminal 2 in relation to that of the reference terminal 3 so that the drain-source voltage of the element Q1 is reduced and causes extinction of Q1. The input voltage of the two inverters I1, I2 remains however steady thanks to the charging of the capacitor C1.

In the meanwhile, again coinciding with the negative front of the control signal applied to the terminal 7, the positive voltage which thus becomes available at the output of the inverter I1 charges the capacitor C5 which predisposes the drain of the element Q2 for a voltage such as to make possible conduction of Q2 at the moment of the next positive front of the control signal on the terminal 7.

Said positive front thus causes momentary conduction of Q2 whose current generates on the resistor R5 a positive voltage drop which causes conduction of Q3 through which the capacitor C1 can discharge to bring the device 1 back to neutral position. Q2 also then returns to neutral when through C4 its gate voltage returns up to a value such as to cause extinction of Q2.

Even in this mode of operation current absorption of the control part is very small and depends on the frequency of the control signal, being still limited to the switching fronts of said control signal.

As explained above the device 1 may be controlled in the manner of an N-channel transistor or in the manner of a P-channel transistor depending on whether the input terminal 6 or the input terminal 7 is used. Several of the same devices controlled in different manners may thus be used to form complex structures which need both N-channel MOS transistors and P-channel MOS transistors. The example shown in FIG. 2 may be considered typical where there is illustrated a load actuator system 10 which is accomplished in the form of a bridge structure including four MOS power devices like the one shown in FIG. 1 of which two, indicated by reference 1N, are employed and controlled as N-channel transistors and the other two, indicated with reference 1P, are employed as channel P transistors. A microprocessor 11 controls the actuator thanks to the low level features of the control signal ensured by the capacitor C2 an the diode D2. It should be noted how the transistors 1N have the terminals 2 and 7 connected together. This has the purpose of keeping surely interdicted the circuit elements Q1–Q4 of the two transistors in N-channel operation.

What is claimed is:

1. MOS power device characterized in that it comprises an N-channel power switch with drain and source connected respectively to a positive supply lead and to a negative supply lead, two inverters in cascade connected for control of the gate of said power switch and two inputs for said inverters a first input being connected to a first control signal with positive voltage in relation to said negative lead and the second input being connected to a second control signal with negative voltage in relation to said positive lead and a capacitor connected between said first input and said negative lead and switching means connected between said positive supply lead and said capacitor and responsive to said second input to allow said second control signal to cause charging of said capacitor at a positive voltage in relation to said negative lead.

2. Device in accordance with claim 1 characterized in that said inverters are accomplished with CMOS technology.

3. Device in accordance with claim 2 characterized in that said inverters are supplied with reduced voltage in relation to that supplied to said power switch said reduced voltage being supplied by an external capacitor placed between said supply leads.

4. Device in accordance with claim 3 characterized in that it comprises means of capacitive coupling associated with said inverters to allow control thereof by signals having voltage lower than said reduced voltage.

5. Device in accordance with claim 1 characterized in that said switching means comprise first MOS switches driven by said second control signal to cause charging of said capacitor and second MOS switches subsequently driven by said signal to cause discharge of said capacitor.

6. Device in accordance with claim 5 characterized in that said first switches comprise a first and a second MOS switch element in source follower connection, the first switch element being controlled by said second control signal and said second switch element being designed to charge said capacitor.

7. Device in accordance with claim 5 characterized in that said second switches comprise a third switch element controlled by said second control signal and a fourth switch element designed for discharge of said capacitor.

* * * * *